United States Patent
Waidhas et al.

(10) Patent No.: US 7,183,652 B2
(45) Date of Patent: Feb. 27, 2007

(54) ELECTRONIC COMPONENT AND ELECTRONIC CONFIGURATION

(75) Inventors: Bernd Waidhas, Pettendorf (DE); Gerald Bock, Regensburg (DE); Albert Schott, Hochdorf (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/115,401

(22) Filed: Apr. 27, 2005

(65) Prior Publication Data

US 2006/0244142 A1    Nov. 2, 2006

(51) Int. Cl.
*H01L 23/48* (2006.01)
*H01L 23/52* (2006.01)
*H01L 29/40* (2006.01)

(52) U.S. Cl. .................. 257/772; 257/779; 257/778; 257/E23.021; 257/E23.023

(58) Field of Classification Search ................ None
See application file for complete search history.

(56) References Cited

U.S. PATENT DOCUMENTS

| | | | |
|---|---|---|---|
| 6,075,710 A | 6/2000 | Lau | |
| 6,469,393 B2 * | 10/2002 | Oya | 257/779 |
| 6,696,757 B2 * | 2/2004 | Yunus et al. | 257/735 |
| 2003/0186072 A1 | 10/2003 | Soga et al. | |
| 2006/0014309 A1 * | 1/2006 | Sachdev et al. | 438/17 |

FOREIGN PATENT DOCUMENTS

| | | | | |
|---|---|---|---|---|
| JP | 60-154632 | * | 8/1985 | 257/758 |
| JP | 2000-101014 | * | 4/2000 | |
| JP | 2002239780 A | | 8/2002 | |

* cited by examiner

*Primary Examiner*—Jasmine Clark
(74) *Attorney, Agent, or Firm*—Edell, Shapiro & Finnan, LLC

(57) ABSTRACT

An electronic component includes a substrate with outer contact areas comprising copper. Lead-free solder bumps are disposed on the outer contact areas of the electronic component. An electronic configuration includes an electronic component and a printed circuit board. The electronic component is mounted on the printed circuit board by lead-free solder electrical connections.

30 Claims, 3 Drawing Sheets

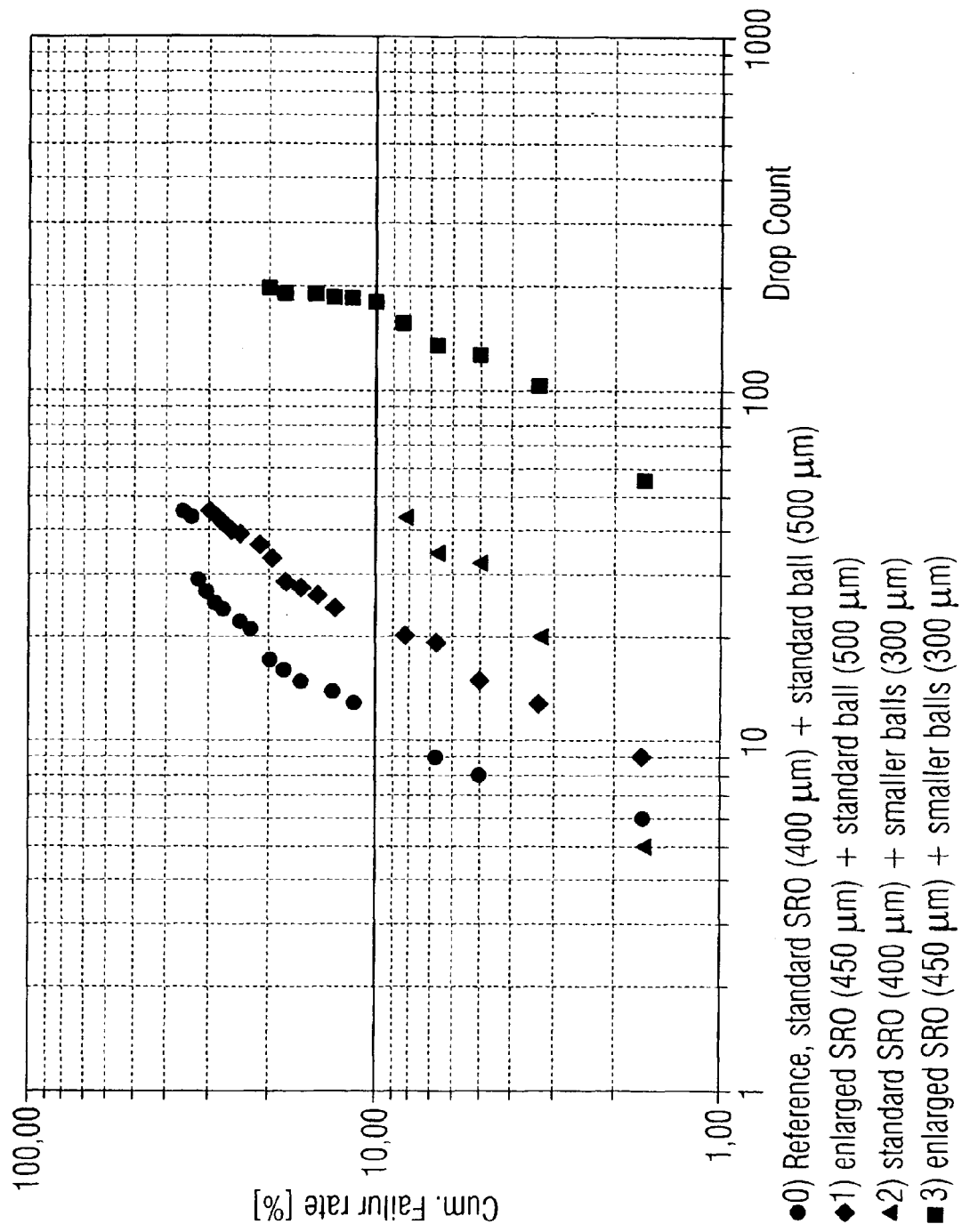

ELECTRONIC COMPONENT AND ELECTRONIC CONFIGURATION

FIELD OF THE INVENTION

The present invention relates to electronic components and electronic configurations.

BACKGROUND

Semiconductor packages including a semiconductor chip are typically mounted on a substrate, such as a printed circuit board (PCB), which includes other electronic components. Conductor tracks of the PCB provide the desired electrical connections between the different electronic components. The PCB typically forms an electronic subsystem for use in a particular good or a particular range of goods.

These printed circuit boards are often a used in a variety of situations in which the printed circuit board and the semiconductor packages undergo repeated mechanical stress. This may lead to failure of the subsystem due to cracks in the interconnection between the component and the printed circuit board. This is particularly a problem for consumer goods, such as mobile telephones.

Semiconductor packages and electronic configurations, which can better withstand mechanical stress and can be manufactured less expensively, are desirable. Additionally, avoiding lead-based solder for mounting and electrically connecting electronic components to printed circuit boards is desirable, lead-free solder connections are often less mechanically robust than electrical connections provided by lead-based solder.

SUMMARY

An electronic component can be manufactured cost-effectively and reliably mounted on a printed circuit board using lead-free solder. Further, an electronic configuration can include such an electronic component mounted on a printed circuit board.

An electronic component according to the invention includes a semiconductor chip and a substrate. The substrate includes a dielectric body with a first upper surface and a second lower surface. A plurality of first inner package contact areas are disposed on the upper surface of the substrate and a plurality of second outer package contact areas are disposed on the lower surface. The inner contact areas or pads are electrically connected to the outer contact areas or pads by electrically conducting tracks disposed on the upper and lower surface of the substrate and by electrically conducting vias which reach through the thickness of the substrate from the upper to the lower surface. This type of substrate has a single layer structure.

Alternatively, if the substrate has a multi-layer structure, electrically conducting tracks are disposed on layers within the body of the substrate in addition to the upper and lower surfaces. In this type of structure, vias reach through the thickness of each of the layers of the substrate to electrically connect the conductor tracks on the different layer and to provide electrically conducting paths from the inner contact areas to the outer contact areas. The substrates are also known as laminates. The plurality of second outer contact areas include copper or a copper based alloy.

A first insulating layer is disposed on the lower surface of the dielectric body. The insulating layer is an electrically insulating material and a solder resist layer. A solder resist layer includes material that solder does not wet. The first insulating layer includes a plurality of the first apertures or through openings. An aperture is located on each of the outer contact areas, for example, towards the lateral center. Therefore, at least the central portion of each of the second contact areas remains free from the insulating layer. The outer surface of the insulating layer provides the outer lower surface of the electronic component.

The electronic component also includes a plurality of bumps for mounting and electrically connecting the electronic component to a printed circuit board. A bump is disposed on each of the plurality of second contact areas.

According to the invention, the plurality of bumps may include lead-free solder paste. A solder paste includes the solder material in the form of particles held in a binder, i.e., an organic compound, to have a paste-like consistency. A solder paste can, therefore, be applied to the contact areas by dispensing or screen-printing techniques at room temperature.

Alternatively, the plurality of bumps includes a lead-free solder provided by placing a ball of lead-free solder on each of the second plurality of contact areas and performing a heat treatment so that the solder melts or re-flows to attach the ball to the contact area.

An electronic component according to the invention includes a lead-free solder and contact areas which comprise copper. The use of further metallic layers to cover the copper contact areas to provide corrosion protection is avoided. Providing a lead-free solder paste that contacts the copper contact areas improves the bond between the lead-free solder paste material and the copper. Therefore, the ability of the electronic components to withstand mechanical stress is improved.

The lead-free solder paste, lead-free solder balls and, therefore, the plurality of bumps, for example, include a tin silver copper (SnAgCu) lead-free solder. Such lead-free solder pastes and lead-free solder balls are widely available so that manufacturing costs are not increased and the reflow conditions are well defined so that a reliable electrical connections can be formed.

In an embodiment of the invention, the substrate has a single layer structure. In an alternative embodiment, the substrate has a multilayer structure.

For example, each of the plurality of bumps substantially fills each of the plurality of first apertures and protrudes outwardly from the first aperture. The lead-free solder paste contacts the side walls of the first aperture. Alternatively, a lead-free solder bump is formed by attaching a lead-free solder, ball to the outer contact pad and reflowing or partially reflowing the solder, melting the solder and forming a plurality of bumps attached to the second contact areas. The inner side walls of the first apertures control the lateral spread of the solder and, therefore, each of the plurality of lead-free solder bumps substantially fills each of the plurality of first apertures.

A protruding bump provides a positive standoff between the outer surface of the electronic component and the surface of the printed circuit board. This increases the reliability of the mounting process and improves the reliability of the joints formed between the electronic component and the printed circuit.

The first apertures can be laterally substantially circular. The plurality of bumps, for example, has a substantially domed shape in which the apex of the dome protrudes outwardly from the outer surface of the insulating layer. This arrangement provides a mechanically reliable electrical contact when the electronic component is relatively mounted on the printed circuit board as mechanical stress is more uniformly distributed around the bump.

Each of the plurality of first apertures has a diameter approximately 50% larger than the diameter of each of the plurality of lead-free solder bumps or lead-free solder balls which are applied to the second contact areas. The relationship between the diameter of the first apertures and the diameter of the lead-free solder balls is defined using the diameter of the lead-free solder balls before the solder is partially or completely reflowed to attach the solder to the contact area.

During the solder reflow process, the solder melts and fills the lateral area of the first aperture. Therefore, the lateral dimensions of the second contact areas are defined by the solder mask and is, therefore, an SMD type aperture. The inner side walls of the first aperture, therefore, control the lateral spread of the molten solder so that a lead-free solder bump is formed. The lateral size of the base of the reflowed lead-free solder bump is, therefore, approximately the same as the lateral size of the second contact area.

In one embodiment, each of the plurality of first apertures has a diameter of approximately 450 microns and each of the plurality of lead-free solder bumps has a diameter of approximately 300 microns before the solder is reflowed.

A layer of protective organic material may also be disposed on the copper outer contact areas. The layer of organic material protects the surface of the copper contact form corrosion during the assembly of the electronic component. The bump includes lead-free solder paste or a lead-free solder ball is applied, in this case, onto the organic protection layer. During the solder reflow process, which takes place at high temperatures, the organic material decomposes so that a low resistance electrical connection between the copper contact area and the lead-free solder bump is formed by an intermetallic layer of tin and copper.

The semiconductor chip is electrically conductively connected to the plurality of first inner contact areas disposed on the first upper surface of the substrate.

In an embodiment of the invention, the semiconductor chip is electrically connected to the substrate by a plurality of wire bonds which reach between chip contact pads disposed on the active surface of the chip and the first contact areas. The electronic component further includes plastic encapsulation material, which encapsulates the semiconductor chip, the bond wires and the first surface of the substrate. The outer surfaces of the encapsulation material provide the outer surfaces of the package. The encapsulation material protects the semiconductor chip from the environment, in particular, moisture as well as providing protection from mechanical stress.

In an alternative embodiment of the invention, the semiconductor chip is electrically connected to the substrate by a flip-chip technique. The plurality of first contact areas are arranged towards the lateral centre of the first surface of the substrate and have a lateral arrangement which corresponds to the lateral arrangement the chip contact pads. The active surface of the semiconductor chip, therefore, faces the first surface of the substrate and the semiconductor chip is electrically connected to the substrate by a plurality of flip-chip contacts provided by solder balls. A solder ball is positioned directly between a chip contact pad and its corresponding first contact pad positioned on the upper surface of the substrate.

The cavity formed between the active surface of the semiconductor chip and the first surface of the substrate may be filled by underfill material. In this embodiment, the rear side of the semiconductor chip remains free and is not over-molded. Alternatively, in a further embodiment, the semiconductor chip is over-molded by a plastic material so that the passive rear side and side faces of the chip are embedded in the mold material. The plastic encapsulation material, therefore, encapsulates the semiconductor chip and the plurality of flip-chip contacts.

The substrate of the invention can be used in a variety of types of electronic components in which the semiconductor chip is electrically connected to the substrate by either bond wires or flip-chip contacts. The electronic component may also be of an over-molded or a bare chip type.

The invention also provides electronic configurations, which have an electronic component and a printed circuit board.

An electronic component includes a semiconductor chip and a substrate. The outer lower surface of the substrate provides the outer lower surface of the electronic component. As previously discussed, the lower surface of the substrate includes a plurality of second outer contact areas and a first insulating layer. The plurality of second contact areas include copper or a copper alloy. The first insulating layer includes a plurality of first apertures or through-openings. A first aperture is located on each of the second contact areas.

The plurality of first apertures has a configuration. Configuration is used here to denote that the plurality of apertures has a predetermined lateral arrangement and each of the apertures has a pre-determined size. Each aperture of a plurality can be substantially the same size. The apertures are typically arranged in a regular matrix of rows and columns in which each aperture is located at a predetermined distance or pitch from its adjacent neighbour. Each aperture is further defined by lateral dimensions and a depth.

The printed circuit board typically includes a dielectric board with a structured electrically conducting layer including a plurality of third contact areas and conductor tracks disposed on its upper surface. A second insulating layer is disposed on the upper surface of the printed circuit board covering the electrically conducting layer.

The second insulating layer is also electrically insulating and is a solder resist layer. The second insulating layer includes a plurality of second apertures. A second aperture is located on each of the third contact areas so that at least the central portion of each of the third contact areas remains free from the insulating or solder resist material. The third contact areas are, for example, non-solder mask defined so that the entire contact area is exposed within the third aperture. The plurality of second apertures has a configuration substantially the same as the configuration of the plurality of first apertures provided in the substrate of the electronic component. The second apertures have a second size, second lateral dimensions, and a second depth.

The electronic configuration also includes a plurality of bumps. A bump is disposed between each of the second contact areas and each of the third contact areas. Each bump is mechanically and electrically contacts the second contact area and the third contact area. The plurality of bumps include a lead-free solder.

In one alternative, a plurality of lead-free solder paste bumps was initially applied to the plurality of second contact areas. The solder paste bumps were heated to a higher temperature, typically 220° C. to 260° C. to decompose the binder and melt the solder particles in a solder reflow process. The solder reflow conditions required are typically supplied by the manufacturer of the paste.

Alternatively, a plurality of lead-free solder balls are applied to the plurality of second contact areas. The electronic component is subject to a first solder reflow heat treatment to attached the lead-free solder balls to the second contact areas. After the electronic component is mounted on the printed circuit board, a second solder reflow treatment is carried out to mechanically attach and electrically connect the electronic configuration to the printed circuit board.

The electronic configuration includes a small gap between the lower surface of the electronic component and the upper surface of the printed circuit board. According to the invention, this distance is provided by the size of the first apertures in the first insulating layer of the electronic component and the size of the lead-free solder bumps.

Providing a reduced standoff between the electronic component and the printed circuit board compared to standard BGA packages in combination with the size of the first apertures in the first insulating layer improves the ability of the electronic configuration to withstand mechanical stress without damaging the electrical connection between the contact areas of the electronic component and the contact areas of the printed circuit board. The electronic configuration of the invention has been found in drop tests to provide an improved performance.

The third contact areas provided on the printed circuit board includes a layer of copper or a copper based alloy which is covered by an Organic Surface Preservation (OSP) layer. The OSP layer protects the surface of the third contact areas from corrosion and, consequently, improves the quality and reliability of the electrical connections made between the electronic component and the printed circuit board.

Each of the plurality of first apertures located in the first insulating layer of the electronic component and each of the plurality of third contact areas located on the printed circuit board is, for example, laterally essentially circular. According to the invention, each of the plurality of third contact areas has a diameter of approximately 0.75 to approximately 0.85 of the diameter of each of the plurality of first apertures. In one embodiment, each of the plurality of first apertures has a diameter of approximately 450 microns and each of the plurality of third contact areas has a diameter of approximately 350 microns. This provides a more mechanically robust connection between the electronic component and the printed circuit board as measured by a drop test.

Each of the first and second apertures located in the insulating layers of the electronic component and printed circuit board, respectively, may be laterally substantially circular. Mechanical strength is more uniformly distributed around a solder connection positioned in a laterally essentially circular aperture. A further improvement to mechanical robustness of the configurations is, therefore, provided.

Each of the plurality of first apertures located in the first insulating layer disposed on the electronic component, for example, has a diameter, which is approximately 50% larger than the diameter of each of the lead-free solder bumps or lead-free solder balls applied to the electronic component. In an embodiment, each of the plurality of first apertures may have a diameter of approximately 450 microns and each of the plurality of lead-free solder bumps may have a diameter, before the solder is reflowed to attach the solder to the first second contact area, of approximately 300 microns.

This relationship between the lateral size of the first contact area and the diameter of the solder ball, which is attached to the second contact area, provides a lead-free solder bump after the solder is reflowed. This provides the desired stand-off or distance between the electronic component and the printed circuit board after the electronic component is mounted on the printed circuit board.

According to the invention, the distance between the second insulating layer located on the printed circuit board and the second contact area located on the electronic component is approximately 0.25 to approximately 0.3 of the diameter of each of the plurality of first apertures.

In an embodiment, the distance between the second insulating layer located on the printed circuit board and the second contact area located on the electronic component is approximately 130 microns. Therefore, by increasing the diameter of the first apertures of the electronic component and by reducing the diameter of the lead-free solder ball which is attached to the contact area exposed in the first aperture, the stand-off distance between the electronic component and the printed circuit board on which it is mounted is controlled and, according to the invention, reduced over the conventional configurations. This has been found to lead to an unexpected improvement in the drop test results.

The electronic component according to the invention, and the electronic configurations in which the electronic component is mounted to a printed circuit board, have an improved drop test performance. Drop tests are used to measure the ability of electronic configurations to withstand mechanical stress. Typical conditions under which drop test performance is measured are known in the art and may, for example, involve dropping the configuration onto a hard surface from a known height. The conditions of the test are chosen to simulate the mechanical stress that the consumer good including the electronic configuration is likely undergo when it is used by the consumer. In drop tests, an improvement in the first failure from 5 to 50 drops was observed for an electronic configuration of the invention.

The electronic component and electronic configurations of the invention provide an improved drop test performance while avoiding the use of nickel and gold surface coatings. As a gold coating can lead to embrittlement of the solder joint, a more reliable semiconductor package and a more reliable electronic configuration is provided. Also, the use of an additional underfill material between the electronic component and the printed circuit board can be avoided which simplifies the process and reduces costs.

The use of a lead-free solder bump according to the invention leads to a reduced standoff between the electronic component and the printed circuit board also avoids the possible failure of the contacting process. This is particularly advantageous for mounting laminate-based land or ball grid array packages on a printed circuit board as a process step of selectively applying solder paste deposits on the printed circuit board may be avoided. Additionally, the electronic configuration according to the invention enables the easy repair or exchange of the land grid array package by providing the solder for the interconnection on the electronic component.

The use of lead-free or unleaded solder bumps in electronic configurations, particularly those including a land grid array package, has the further advantage that the configuration conforms to future environmental standards. Future environmental standards require that the use of lead-based solder is replaced by the use of lead-free solder.

BRIEF DESCRIPTION OF THE DRAWINGS

The invention is now explained in detail in the following with reference to the drawings.

FIG. 5 shows a graph of the results of drop tests for packages with different solder resist openings and solder balls with different diameters.

DETAILED DESCRIPTION OF THE PREFERRED EMBODIMENTS

Figure 1:
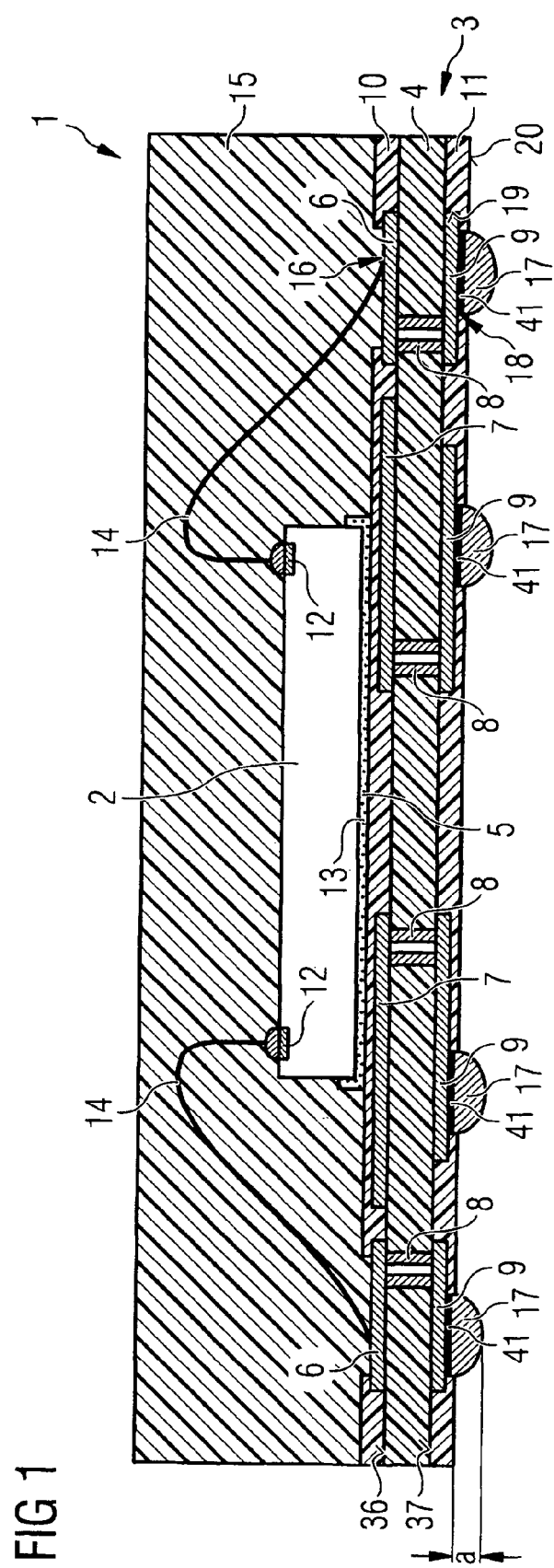
FIG. 1 shows a cross-sectional view of a LGA package according to a first embodiment of the invention including lead-free solder bumps.

FIG. 1 illustrates a surface mountable land grid array (LGA) package 1 according to a first embodiment of the invention. The package 1 includes a semiconductor chip 2 and a substrate 3. The substrate 3 includes a core material 4 of dielectric material, in this case BT, in the form of a board. The substrate 3 includes a chip mounting area 5 positioned in approximately the lateral center of its upper surface 36. The substrate 3 also includes a plurality of inner contact areas 6, which are disposed on the upper surface 36 of the core 4. The inner contact areas 6 are disposed towards the periphery of the substrate 3 of the semiconductor package 1 and, therefore, are disposed laterally outside and laterally surround the chip mounting position 5 and the semiconductor chip 2.

The plurality of inner contact areas 6 are connected by conductor tracks 7 and vias 8 to outer contact areas 9, which are disposed on the lower surface 37 of the core 4 of the substrate 3. Conductor tracks 7 are disposed on the upper 36 and lower 37 surfaces of the core 4 of the substrate 3 and are electrically connected by the vias 8 which extend from the upper surface to the lower surface of the core 4. The inner contact areas 6, conductor tracks 7, vias 8, and outer contact areas 9 include electrically conductive material and provide the rewiring structure of the substrate 3. In the embodiment shown in FIG. 1, the rewiring structure includes oxygen free high conductivity copper.

Additionally, a solder resist layer 10 is disposed on the upper surface of the substrate 3 and covers the electrically conductive conductor tracks 7 and upper surface 36 of the core 4. The solder resist layer 10 includes through openings or apertures positioned above and located on the central portion of the inner contact areas 6. The central portions of the inner contact areas 6 are, therefore, exposed and remain free from the solder resist layer 10. The peripheral regions of the inner contact areas 6 are covered by the solder resist material of the solder resist layer 10.

The semiconductor chip 2 has an active surface which includes a plurality of integrated circuit devices and a plurality of chip contact pads 12. The chip contact pads 12 are arranged in a single row and are disposed towards the peripheral edges of the active surface of the semiconductor chip 2. The semiconductor chip 2 also has an opposing passive surface where no integrated circuit devices are located. The passive surface of the semiconductor chip 2 is mounted in the chip mounting area 5 on the upper surface of the substrate 3 by die attach material 13.

The semiconductor chip 2 is electrically connected to the substrate 3 by a plurality of bond wires 14. A bond wire 14 is disposed between each chip contact pad 12 and an inner contact area 6. The semiconductor chip 2, the plurality of bond wires 14 and the upper surface of the substrate 3 are encapsulated by mold material 15. The outer surfaces of the mold material 15 provide outer surfaces of the semiconductor package 1 housing.

Similarly, a second solder resist layer 11 is disposed on the lower surface 37 of the substrate 3 and covers the electrically conductive redistribution structure and the surface of the core 4 of the substrate 3. The outer contact areas 9 are exposed and remain free from the solder resist as through openings 18 are positioned in the second solder resist layer 11 and are located on the central portion of the outer contact areas 9. The peripheral regions of the outer contact areas 9 are covered by the material of the second solder resist layer 11. The outer contact areas 9 are, therefore, solder mask defined (SMD) pads.

The solder resist layers 10, 11 include electrically insulating material, which is not wet by the material used to mechanically mount and electrically connect the package 1 to an external higher-level substrate such as a printed circuit board.

In this embodiment of the invention, a surface protection layer 41 is disposed on each of the outer contact areas 9. The surface protection layer 41 includes an organic material. The semiconductor package 1 also includes lead-free solder paste bumps 17. A lead-free solder paste bump 17 is disposed on each of the outer contact areas 9 of the LGA package.

In this embodiment of the invention, the outer contact areas 9 include oxygen free high conductivity copper. The lead-free solder bump includes a paste which includes tin, copper and silver and binder materials.

The outer contact areas 9 are laterally disposed with a desired arrangement, for example, a matrix of rows and columns in which the outer contact areas have a desired pitch. Typically, the outer contact areas 9 have a determined pitch between, for example, the central point of each of the plurality of outer contact areas 9. The arrangement can correspond to agreed industry standards and in this embodiment the pitch is 0.8 mm.

Furthermore, in this embodiment of the invention, the lead-free solder paste bump 17 laterally substantially fills the through opening 18 in the second solder resist layer 11 and protrudes from the outer surface 20 of the second solder resist layer 11 by a distance a. The solder paste bump 17 is in contact with the side wall 19 of the through-opening 18.

In this embodiment of the invention, the lead-free solder paste bumps 17 include a SnAgCu solder paste. The solder paste bumps 17 were applied to the outer contact areas 9 of the package 1 using a screen printing process. Later in the process, the solder paste will reflow by undergoing a heat treatment process. During this heat treatment, the surface protection layer 41 decomposes so that an electrical contact is provided between the outer contact area 9 and the solder material.

The side walls 19 of the through openings 18, therefore, provide mechanical control of the lateral spread of the lead-free solder paste bump 17 during the application process and control of the lateral spread of the molten solder during the solder reflow process.

The distance a by which the solder paste bumps 17 protrude from the outer surface of the package 1 provides a stand-off distance between the lower surface 20 of the package 1 from the upper surface of the printed circuit board when the package 1 is placed on a printed circuit board (PCB). This is more clearly seen in the embodiments shown in FIGS. 2 and 3.

Figure 2:
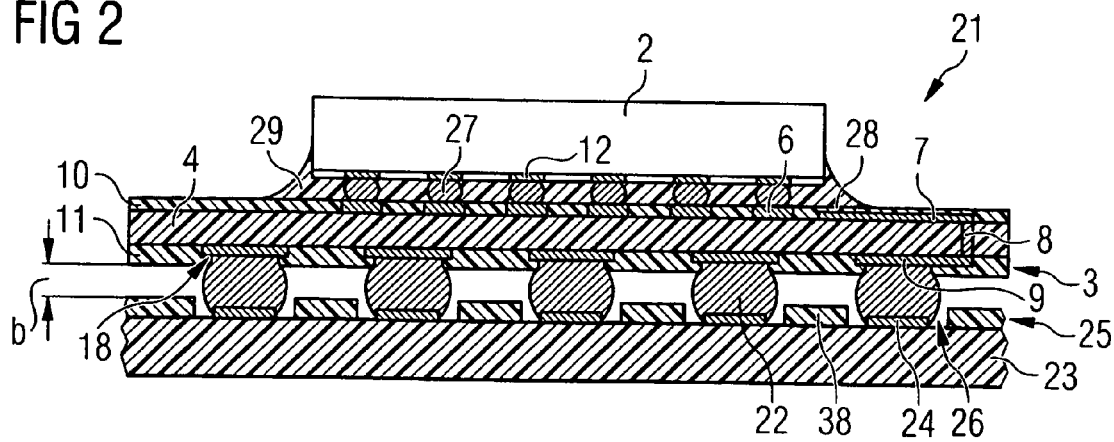
FIG. 2 illustrates a cross-sectional view of an electronic configuration including a LGA package according to a second embodiment of the invention.

FIG. 2 illustrates an electronic configuration which includes a semiconductor LGA package 21, which is mounted on a printed circuit board 23 according to a second embodiment of the invention. Parts of the second LGA package 21 which are essentially the same as those of the first LGA semiconductor package 1 of the first embodiment of the invention are denoted by the same reference number and are not necessarily described again.

The second semiconductor LGA package 21 differs from the first embodiment of the invention in that lead-free solder balls 22 are provided on the outer contact areas 9 of the semiconductor package 21. The lead-free solder balls 22 are disposed directly on the copper outer contact pads 9 of the semiconductor package 21.

The second LGA package 21 is mounted on and electrically conductively connected to a printed circuit board 23. The printed circuit board typically includes a number of electronic components which are electrically connected to form the desired system. Only a portion of the printed circuit board on which the package 1 is mounted is depicted in FIG. 2.

The upper surface of the printed circuit board 23 includes an electrically conductive rewiring layer 25, which includes a plurality of component contact areas 24 and a plurality of conductor tracks (not shown for clarity). The component contact areas 24 are copper and are covered during storage and manufacturing of the printed circuit board by an organic surface protection layer. Since, in the diagram, the solder has been reflowed, the OSP layer is not visible.

The component contact areas 24 have a lateral arrangement, which is substantially the same as that of the lateral arrangement of the lead-free solder balls 22 of the package 21. A solder resist layer 38 is disposed on the upper surface of the printed circuit board 23 and includes through openings 26 in which the component contact areas 24 of re-wiring layer 25 are exposed. In contrast to the outer contact areas 9 of the package 21, the component contact areas 24 of the printed circuit board 23 are NSMD (Non-Solder Mask Defined) pads and, therefore, the through openings 26 in the solder resist layer 38 are laterally larger than the component contact areas 24.

The through openings 26 in the solder resist layer 38 of the PCB 23, therefore, have a lateral arrangement which is essentially the same as the lateral arrangement of the through-openings 16 located in the second solder resist layer 11 of the semiconductor package 21.

The relative sizes of the through openings 16 and contact areas 24 are described with reference to FIG. 4. The plurality of package through openings 16 and the plurality of PCB through openings 26 are arranged in a matrix of rows and columns. The plurality of through-openings 16 disposed on the substrate 3 and the plurality of through openings 18 disposed on the printed circuit board 23 have substantially the same pitch. The pitch is defined as the distance between the lateral center of adjacent through-openings within the plurality.

Similarly the lateral arrangement of the plurality of outer contact areas 9 and component contact areas 24 is substantially the same. Each contact area of each plurality is separated from its adjacent neighbor by substantially the same distance so that the arrangement has determined pitch. The pitch of the plurality of outer contact areas 9 is substantially the same as the pitch of the plurality of component contact areas 24.

In this embodiment of the invention, the semiconductor chip 2 is mounted to the substrate 3 by flip-chip technique. The chip contact areas 12 are, therefore, located towards the lateral center of the active surface of the chip and the chip is mounted with its active surface facing the upper surface 36 of the substrate 3. The inner contact areas 6 are located in the chip mounting area 5 on the upper surface 36 of the substrate 3 and have a lateral arrangement which is essentially the same as the lateral arrangement of the chip contact areas 12. A flip-chip contact, in this case, a solder ball 27 is positioned between and mechanically and electrically connects each chip contact pad 12 and an inner contact pad 6.

In the semiconductor package 21 of FIG. 2, the cavity 28 formed between the active surface of the semiconductor chip and the upper surface 36 of the substrate 3 is filled by underfill material 29. The rear passive surface of the semiconductor chip 2 remains exposed and is uncovered my mold or encapsulation material.

In this embodiment of the invention, each of the plurality of lead-free solder balls 22 has a diameter of approximately 300 microns ($\mu$m) when it is applied to the outer contact area 9 of the package 21. Each of the through-openings 16 in the solder resist layer 11 of the substrate 3 is laterally approximately circular and has a diameter of approximately 450 $\mu$m.

The through-opening 26 in the solder resist layer 38 on the printed circuit board 23 is laterally larger than the solder ball 22. The relative sizes of the through-opening 16 on the substrate 3 of the package 21 and the solder ball 22 are chosen to provide a reduced stand off distance b between the lower surface 20 of the package 21 and the upper surface 40 of the printed circuit board 23 compared to standard packages. A through-opening 16 with a diameter 50% greater or 150% of the diameter of the solder ball 22 has been observed to have an improved drop test performance as is illustrated with reference to FIG. 5.

Figure 3:
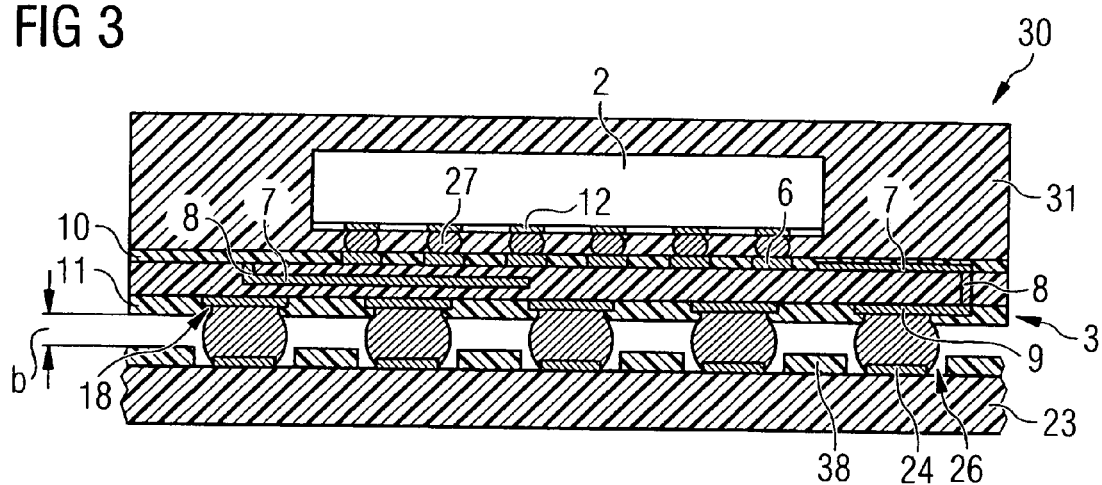
FIG. 3 depicts a cross-sectional view of an electronic configuration including a LGA package according to a third embodiment of the invention.

FIG. 3 shows a cross-sectional view of the semiconductor package 30 according to a third embodiment of the invention. The semiconductor package 30 includes a semiconductor chip 2 mounted on the substrate 3 by a flip-chip technique. In this package, the semiconductor chip 2 is overmolded and so the rear passive side and side faces of the chip, as well as the flip-chip contacts 22 are encapsulated in the mold material 31.

In this embodiment of the invention, the lead-free solder paste bumps 17 of FIG. 1 have undergone a reflow heat treatment to provide lead-free solder bumps 42, which have a domed-shape. A solder bump 42 is disposed on each of the outer contact areas 9 of the semiconductor package 1. The apex of the dome protrudes outwardly from the lower surface 20 of the LGA package 1 and lies in a plane below that of the lower surface 20 as viewed in FIG. 3.

FIG. 3 illustrates that the package 30 includes a multilayer substrate 3 in which conductor tracks 7 are disposed on different layers within the dielectric body 4 of the substrate as well as on the upper surface 36. The conductor tracks 7 located on different layers are electrically connected by vias 8 which are positioned between the conductor tracks 7. The semiconductor package 30, therefore, includes a laminate-type substrate.

A thin organic surface protection layer is also provided on the surface of the copper component contact areas 34 of the PCB 30. The organic surface protection layer protects the surface of the copper outer contact areas 9 of the semiconductor packages 1, 21 and the component contact areas 34 from corrosion during the storage, manufacturing and assembly of the semiconductor package and the printed circuit board. The organic surface protection coating decomposes at the temperatures typically used in the solder reflow process and is not normally visible in the mounted configuration.

Figure 4:
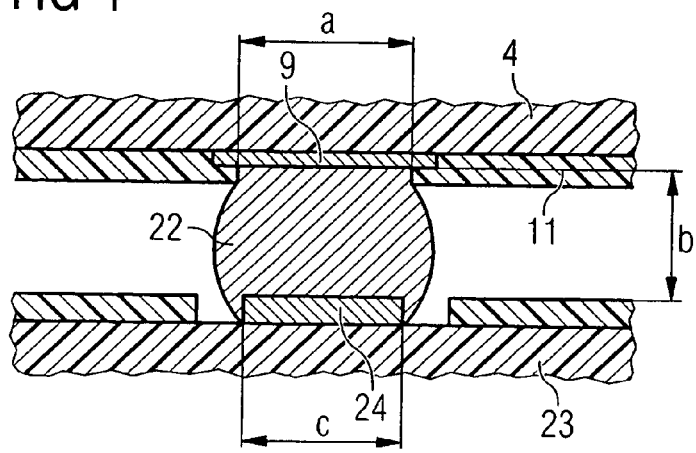
FIG. 4 shows a detail of an outer package contact.

FIG. 4 illustrates an enlarged view of a solder ball 22 disposed between an outer contact area 9 of the semiconductor package 21 and a component contact area 24 located on the printed circuit board 23. FIG. 4 more clearly illustrates that the outer contact pad is a SMD (solder mask defined) pad whereas the component contact area 24 is a non-solder mask defined (NSMD) pad.

If the outer contact areas 9 of the package 1 have a pitch of 0.8 mm, according to one embodiment of the invention, the through opening 16 in the solder resist layer 11 and, therefore, the exposed portion forming the outer contact area 9, of the package has a diameter a of approximately 450 μm. The component contact areas have a diameter b of approximately 350 μm. If a solder ball 22 with a diameter of 300 μm is applied to the outer contact area 9, then after the package 1 is mounted to the printed circuit board 23, the distance b between the package and the printed circuit board 23 is approximately 130 μm.

According to the invention, the diameter c of the component contact areas 24 is approximately 0.75 to approximately 0.65 × (multiplied by) a and the distance b is approximately 0.25 to approximately 0.3 × (multiplied by) a.

In comparison, for standard packages the through openings in the solder resist layer of the package have a diameter of approximately 400 μm, the solder ball has a diameter of approximately 500 μm and the distance b is approximately 398 μm.

The results of drop tests for packages fabricated with these relationships between the dimensions of the solder resist through opening, solder ball and stand-off b are illustrated in FIG. 5.

The reference package has solder resist openings (SRO) of 400 μm and solder balls with a diameter of approximately 500 μm. Package 1 has enlarged solder resist openings of approximately 450 μm and solder balls with a diameter of approximately 500 μm. Package 2 has solder resist openings of approximately 400 μm and solder balls with a smaller diameter of approximately 300 μm. Package 3 includes enlarged solder resist openings of 450 μm and smaller solder balls with a diameter of 300 μm.

As can be seen in FIG. 5 from the graph of the results of the drop tests, the drop count until the first failure is improved from 1 for the reference package to over 50 for the package 3. Further analysis indicates that the Equivalent stress according to von Mises (SEQV) can be reduced at the substrate (package) side by approximately 18.5%.

The invention also relates to methods of assembling a semiconductor package and to methods of mounting the semiconductor package on the printed circuit board.

A panel is provided which includes a plurality of component positions, each component position providing the substrate 3 for a single semiconductor package 1, 21, 30. A semiconductor chip 2 is mounted on the chip mounting area 5 of the substrate 3 and electrically connected to the inner contact areas 6 on the upper surface of the substrate 3. The electrical connections my be provided by bond wires 14 or by flip-chip contacts 22. The semiconductor chip 2 and upper surface of the substrate 3 may then encapsulated in an epoxy encapsulation material 15, 31.

At this stage of the assembly process, lead-free solder paste or lead-free solder balls 22 may be applied to the outer contact areas 9 of the plurality of component positions. Alternatively, the individual semiconductor packages 1, 21, 30 may be separated from the panel and then the lead-free solder paste or lead-free solder balls 22 applied to the outer contact areas of each package 1, 21, 30 individually. The lead-free solder paste is applied to the contact areas by a screen printing technique to form the bumps 17. Alternatively, a lead-free solder ball 22 is placed on each of the outer contact areas 9 of the substrate and the solder reflowed to attach the solder ball 22 to the outer contact area 9.

A printed circuit board 23 is then provided which includes a component mounting position suitable for the semiconductor package 1, 21, 30. The lateral arrangement of the contact areas 24 on the printed circuit board 23, therefore, corresponds to the lateral arrangement of the outer contact areas 9 and lead-free solder bumps 17, 22 of the semiconductor package 1, 21. Lead-free-solder paste is then applied to each of the component contact areas 24.

The package 1, 21, 30 is aligned with the component mounting position on the printed circuit board 23 so that the solder material 17, 22 is in contact with both the outer contact areas 9 of the package 1, 21 and the solder paste positioned on the component contact areas 24 of the printed circuit board 23 The configuration then undergoes a solder reflow heat treatment in order to melt the solder and provide an electrical connection between the semiconductor package 1, 21, 30 and the printed circuit board 23.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

Reference Numbers
1 first semiconductor package bump
2 semiconductor chip
3 substrate
4 core
5 chip mounting area
6 inner contact area
7 conductor track
8 via
9 outer contact area
10 first solder resist layer
11 second solder resist layer
12 chip contact pads
13 die attach material
14 bond wire
15 mold material
16 aperture
17 solder bump
18 through opening
19 side wall
20 lower surface of package
21 second semiconductor package
22 solder ball
23 first printed circuit board
24 contact area
25 rewiring layer
26 through opening
27 solder ball
28 cavity
29 underfill
30 third package
31 mold material
36 upper surface of core
37 lower surface of core
38 solder resist layer
40 upper surface
41 organic surface protection
42 Solder bumps

What is claimed is:

1. An electronic component comprising:
    a semiconductor chip;
    a substrate, the substrate including:
        a dielectric body including a first surface and a second surface,
        a plurality of first contact areas disposed on the first surface,
        a plurality of second contact areas disposed on the second surface, wherein each of the plurality of second contact areas includes one of copper and a copper alloy;
    a first insulating layer disposed on the second surface, wherein said first insulating layer includes a plurality of first apertures, each of the plurality of first apertures being located at a respective one of the second contact areas; and
    a plurality of bumps, each of the plurality of bumps being disposed on a respective one of the second contact areas, wherein each of the plurality of bumps comprises lead-free solder and each first aperture includes a diameter that is approximately 50% larger that a diameter of each of the plurality of lead free solder bumps before the solder is reflowed.

2. The electronic component according to claim 1, wherein the substrate a single layer structure.

3. The electronic component according to claim 1, wherein the substrate comprises a multilayer structure.

4. The electronic component according to claim 1, wherein each of the plurality of bumps comprises SnAgCu.

5. The electronic component according to claim 1, wherein each of the plurality of bumps substantially fills and protrudes from each of the plurality of first apertures.

6. The electronic component according to claim 5, wherein each of the plurality of first apertures is laterally substantially circular and each of the plurality of bumps includes a substantially dome-shape.

7. The electronic component according to claim 1, wherein each of the plurality of first apertures has a diameter approximately 450 microns and each of the plurality of lead-free solder bumps has a diameter of approximately 300 microns before the solder is reflowed.

8. The electronic component according to claim 1, further comprising:
    a layer of organic material disposed on the plurality of second contact areas.

9. The electronic component according to claim 1, wherein the semiconductor chip is electrically conductively connected to the plurality of first contact areas by a plurality of bond wires, and the electronic component further includes plastic encapsulation material encapsulating the semiconductor chip and the plurality of bond wires.

10. The electronic component according to claim 1, wherein the semiconductor chip is electrically conductively connected to the plurality of first contact areas by a plurality of flip-chip contacts.

11. The electronic component according to claim 10, wherein the electronic component further includes plastic encapsulation material encapsulating the semiconductor chip and the plurality of flip-chip contacts.

12. An electronic configuration comprising:
    an electronic component comprising:
        a semiconductor chip;
        a substrate, the substrate including:
            a plurality of second contact areas, wherein each of the plurality of second contact areas includes one of copper and a copper alloy, and
            a first insulating layer, wherein the first insulating layer includes a plurality of first apertures, each of the plurality of first apertures being located at a respective one of the second contact areas and including a laterally substantially circular shape; and
    a printed circuit board, the printed circuit board including:
        a plurality of third contact areas, wherein each of the plurality of third contact areas comprises one of copper and a copper alloy, and each of the plurality of third contact areas includes a laterally substantially circular shape and has a diameter of approximately 0.75 to approximately 0.85 of a diameter of each of the plurality of first apertures;
        a second insulating layer, the second insulating layer including a plurality of second apertures, each of the second apertures being located at a respective one of the third contact areas, the plurality of second including a configuration that matches a configuration of the plurality of first apertures,
        a plurality of bumps, each of the plurality of bumps being disposed between a respective one of the plurality of second contact areas and a respective one of the plurality of third contact areas, wherein each of the plurality of bumps comprises lead-free solder.

13. The electronic component according to claim 12, wherein the substrate comprises a single layer structure.

14. The electronic component according to claim 12, wherein the substrate comprises a multilayer structure.

15. The electronic configuration according to claim 12, wherein each of the plurality of bumps comprises SnAgCu.

16. The electronic configuration according to claim 12, wherein each of the plurality of first apertures has a diameter of approximately 450 microns and each of the plurality of third contact areas has a diameter of approximately 350 microns.

17. The electronic configuration according to claim 12, wherein each of the plurality of first apertures has a diameter approximately 50% larger than the diameter of each of the plurality of lead free solder bumps before the solder is reflowed.

18. The electronic configuration according to claim 17, wherein each of the plurality of first apertures has a diameter of approximately 450 microns and each of the plurality of lead-free solder bumps has a diameter of approximately 300 microns before the solder is reflowed.

19. The electronic configuration according to claim 12, wherein the second insulating layer on the printed circuit board is located at a distance from the second contact area located on the electronic component and the distance is approximately 0.25 to approximately 0.3 of the diameter of each of the plurality of first apertures.

20. The electronic configuration according to claim 12, wherein the distance between the second insulating layer located on the printed circuit board and the second contact area located on the electronic component is approximately 130 microns.

21. The electronic configuration according to claim 12, wherein the semiconductor chip is electrically conductively connected to the plurality of first contact areas by a plurality of bond wires, and plastic encapsulation material encapsulates said semiconductor chip and the plurality of bond wires.

22. The electronic configuration according to claim 12, wherein the semiconductor chip is electrically conductively connected to the plurality of first contact areas by a plurality of flip-chip contacts.

23. The electronic configuration according to claim 22, wherein the electronic component further includes plastic encapsulation material, the plastic encapsulation material encapsulating the semiconductor chip and the plurality of flip-chip contacts.

24. An electronic configuration according to claim 12, wherein the electronic component comprises a LGA semiconductor package.

25. The electronic component of claim 1, wherein each of the plurality of bumps comprises a lead-free solder paste.

26. The electronic component of claim 1, wherein each of the plurality of bumps comprises a lead-free solder ball.

27. An electronic configuration comprising:
an electronic component comprising:
a semiconductor chip;
a substrate, the substrate including:
a plurality of second contact areas, wherein each of the plurality of second contact areas includes one of copper and a copper alloy, and
a first insulating layer, wherein the first insulating layer includes a plurality of first apertures, wherein each of the plurality of first apertures is located at a respective one of the second contact areas and has a diameter approximately 50% larger than a diameter of each of the plurality of lead free solder bumps before the solder is reflowed; and
a printed circuit board, the printed circuit board including:
a plurality of third contact areas;
a second insulating layer, the second insulating layer including a plurality of second apertures, each of the second apertures being located at a respective one of the third contact areas, the plurality of second apertures including a configuration that matches a configuration of the plurality of first apertures, and
a plurality of bumps, each of the plurality of bumps being disposed between a respective one of the plurality of second contact areas and a respective one of the plurality of third contact areas, wherein each of the plurality of bumps comprises lead-free solder.

28. The electronic configuration according to claim 27, wherein each of the plurality of first apertures has a diameter of approximately 450 microns and each of the plurality of lead-free solder bumps has a diameter of approximately 300 microns before the solder is reflowed.

29. An electronic configuration comprising:
an electronic component comprising:
a semiconductor chip;
a substrate, the substrate including:
a plurality of second contact areas, wherein each of the plurality of second contact areas includes one of copper and a copper alloy, and
a first insulating layer, wherein the first insulating layer includes a plurality of first apertures, each of the plurality of first apertures being located at a respective one of the second contact areas; and
a printed circuit board, the printed circuit board including:
a plurality of third contact areas;
a second insulating layer, the second insulating layer including a plurality of second apertures, each of the second apertures being located at a respective one of the third contact areas, the plurality of second apertures including a configuration that matches a configuration of the plurality of first apertures, wherein the second insulating layer is located at a distance from the second contact areas located on the electronic component of approximately 0.25 to approximately 0.3 of the diameter of each of the plurality of first apertures, and
a plurality of bumps, each of the plurality of bumps being disposed between a respective one of the plurality of second contact areas and a respective one of the plurality of third contact areas, wherein each of the plurality of bumps comprises lead-free solder.

30. The electronic configuration according to claim 29, wherein the distance between the second insulating layer located on the printed circuit board and the second contact area located on the electronic component is approximately 130 microns.

* * * * *

UNITED STATES PATENT AND TRADEMARK OFFICE
CERTIFICATE OF CORRECTION

PATENT NO. : 7,183,652 B2
APPLICATION NO. : 11/115401
DATED : February 27, 2007
INVENTOR(S) : Bernd Waidhas et al.

It is certified that error appears in the above-identified patent and that said Letters Patent is hereby corrected as shown below:

Column 13, line 22: replace "larger that a" with -- larger than a --;

Column 13, line 40: replace "approximately 450 microns" with -- of approximately 450 microns --.

Signed and Sealed this

Sixth Day of January, 2009

JON W. DUDAS
*Director of the United States Patent and Trademark Office*